United States Patent [19]

Leppänen et al.

[11] Patent Number: 5,692,105
[45] Date of Patent: Nov. 25, 1997

[54] TRANSCODING AND TRANSDECODING UNIT, AND METHOD FOR ADJUSTING THE OUTPUT THEREOF

[75] Inventors: Reijo Leppänen, Espoo; Marko Vänskä, Nummela, both of Finland

[73] Assignee: Nokia Telecommunications Oy, Espoo, Finland

[21] Appl. No.: 428,220

[22] PCT Filed: Sep. 19, 1994

[86] PCT No.: PCT/FI94/00414

§ 371 Date: May 19, 1995

§ 102(e) Date: May 19, 1995

[87] PCT Pub. No.: WO95/08877

PCT Pub. Date: Mar. 30, 1995

[30] Foreign Application Priority Data

Sep. 20, 1993 [FI] Finland ................... 934116

[51] Int. Cl.$^6$ ........................................ G10L 3/02
[52] U.S. Cl. ................. 395/2.94; 370/336; 370/521; 375/240; 455/33.1; 455/56.1; 455/116; 330/144
[58] Field of Search .................. 395/2.94, 2.79; 370/79, 95.1, 95.3, 337, 347, 521, 336, 477; 379/58–60; 455/33.1, 56.1, 38.1, 54.1, 49.1, 72, 116; 330/144.13; 375/222, 240

[56] References Cited

U.S. PATENT DOCUMENTS

| | | | |
|---|---|---|---|
| 4,254,502 | 3/1981 | DeFreitas et al. | 375/30 |
| 5,111,454 | 5/1992 | Hung et al. | 370/95.3 |
| 5,239,541 | 8/1993 | Murai | 455/277.2 |
| 5,303,268 | 4/1994 | Tsutsumi et al. | 375/60 |
| 5,337,006 | 8/1994 | Miyazaki | 455/116 |
| 5,436,900 | 7/1995 | Hammar et al. | 455/33.1 |

FOREIGN PATENT DOCUMENTS

| | | | |
|---|---|---|---|
| WO9214344 | 8/1992 | WIPO | H04Q 7/04 |
| WO9308667 | 4/1993 | WIPO | H04Q 7/04 |

OTHER PUBLICATIONS

Mouly et al., *The GSM System for Mobile Communications*, 1992, pp. 149–184.
Fascicle III.4—Rec. G.711, "7.1 Coding of analogue signals by pulse code modulation", pp. 175–184, 1972.
*GSM Full–Rate Speech Transcoding*, ETSI/GSM, version 3.2.0, Jul. 5, 1989, pp. 1–93.
*Inband Control of Remote Transcoders and Rate Adaptors*, ETSI/GSM, Oct. 1994, pp.1–29.

*Primary Examiner*—Kee M. Tung
*Attorney, Agent, or Firm*—Cushman Darby & Cushman Intellectual Property Group of Pillsbury Madison & Sutro LLP

[57] ABSTRACT

A transcoding and transdecoding unit in a digital mobile radio system, and methods for adjusting their output signals. The unit includes an expander for converting companded digital data into a linear signal; a speech encoder for coding a linearized signal into encoded form; and an amplifier for amplifying the expanded signal. In order that the outbound audio signal not suffer interference due to the raised level, the transcoding unit further includes a level monitor for monitoring the amplitude of the linearized signal and for controlling amplifier such that the signal produced by the amplifier is of a desired level.

22 Claims, 2 Drawing Sheets

TRANSCODING AND TRANSDECODING UNIT, AND METHOD FOR ADJUSTING THE OUTPUT THEREOF

FIELD OF THE INVENTION

The invention relates to a transcoding unit and a transdecoding unit in a digital mobile radio system.

The invention further relates to a method for adjusting the output signal of a transcoding unit and the output signal of a transdecoding unit in a digital mobile radio system.

BACKGROUND OF THE INVENTION

Voice-frequency signals, i.e. speech signals, data signals, and signalling, all encoded into digital bits, are transmitted on the data channel of a Digital Base Station System (DBSS) of a digital mobile radio or radio telephone system. Certain base station system parts processing the data channels can be implemented such that they shape the speech signal. Such shaping may be, e.g., amplification, attenuation, and cutting signal level peaks.

In the prior art systems, speech signals transmitted in the data channel have been amplified in order that the voice formed on the basis of the signal heard by the user of a subscriber station or the subscriber of a telecommunications network will have a sufficient strength. In addition to amplification, the signal typically has to be transcoded, and transdecoded, e.g., by the LTP (Long Term Prediction) or RPE (Regular Pulse Excitation) or LPC (Linear Predictive Coding) method. The GSM system has typically utilized a combination of these, i.e. an RPE-LTP-LPC method, described, e.g., in *The GSM System for Mobile Communications*, by M. Mouly and M. B. Pautet, 1992, 49 rue Louise Bruneau, Palaiseau F-91120, p. 155–162. A more detailed description of the methods can be found in GSM 06.10, January 1990, *GSM Full Rate Speech Transcoding*, ETSI, 93 p. These coding methods handle drastic amplitude variations and instances of exceeding of an allowable amplitude range occurring in the signal to be encoded so that the subscriber receiving the signal and thus hearing the voice experiences distortion and strong interferences in the voice. This is a major problem particularly in the GSM system, where the signal to the subscriber is amplified in order that the transmitted signal heard by the subscriber will have a higher strength.

SUMMARY OF THE INVENTION

The object of the present invention is to provide a method and a system, by means of which a signal to be transmitted in a telecommunications system can be amplified without causing the signal to be amplified to such an extent that its amplitude exceeds the dynamic range of the equipment used in transmission or coding in the telecommunications system.

The invention thus relates to a transcoding unit in a digital mobile radio system comprising an expander unit for converting companded digital data into a linear signal; a speech encoder for coding a linearized signal into encoded form; and an amplifying means for amplifying the expanded signal.

This new transcoding unit of a digital mobile radio system according to the invention is implemented such that it is characterized in that it further comprises a level-monitoring means for monitoring the amplitude of the linearized signal and for controlling the amplifying means such that the signal produced by the amplifying means is of a desired level.

The invention also relates to a transdecoding unit in a digital mobile radio system, comprising a speech decoder for converting encoded data into linear form; an amplifying means for amplifying the linear data; and a compander unit for companding the amplified linear data. The transdecoding unit of the invention is characterized in that it further comprises a level monitoring means for monitoring the amplitude of the linearized signal and controlling the amplifying means such that the signal produced by the amplifying means is of a desired level.

The invention further relates to a method for adjusting the output signal of a transcoding unit in a digital mobile radio system, where companded digital data is expanded into a linear signal, and the linear signal is encoded. This method is characterized in that it further comprises measuring the amplitude of the linearized signal; and adjusting amplification of the signal to be applied to the speech encoder on the basis of the measuring result.

The invention also relates to a method for adjusting the output signal of a transdecoding unit in a digital mobile radio system, where encoded data is coded into linear form, the linear data is amplified, and the amplified linear data is companded. This method is characterized by measuring the amplitude of the linear signal; and adjusting amplification of the linearized data on the basis of the measuring result.

The invention is based on the idea that the signal strength is adjusted in the digital base station system by utilizing a level-adjusting means. In the invention, a voice-frequency signal, such as speech or music (which will be referred to as a speech signal below), is amplified and the magnitude of the amplification is adjusted. The adjustment is based on the fact that the base station system part encoding or processing the signal performs the adjustment on the basis of signal strength and its variations.

An advantage of these methods and equipment equipment of the present invention, is that the signal will be subjected to basic amplification which improves audibility while preventing excessive distortion of the signal at high strengths. The speech signal can be shaped such that it is amplified at lower signal strengths while the amplification is diminished or removed at high levels. This provides the advantage that the audibility of the signal is improved from the viewpoint of the user of the telecommunications network, especially when there is noise around the user. The operating conditions are noisy typically when the subscriber station, such as a mobile radio, is positioned in a moving vehicle, or a portable phone is used in a large crowd of people.

BRIEF DESCRIPTION OF THE DRAWINGS

In the following, the invention will be described more fully with reference to the attached drawings, in which.

DETAILED DESCRIPTION OF PREFERRED EMBODIMENTS OF THE INVENTION

Figure 1:
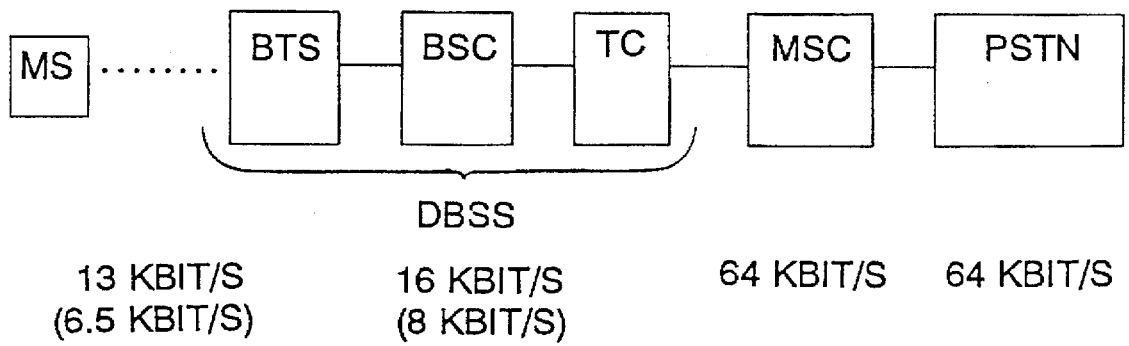
FIG. 1 is a block diagram illustrating a telecommunications system where the equipment and method according to the invention can be applied.

FIG. 1 shows a block diagram illustrating a telecommunications system where the equipment and method according to the invention can be applied. The digital base station system DBSS, with which the invention is concerned, comprises a transcoder TC, which converts a speech signal between two different representations. The conversion takes place between a PCM signal (64 kbit/s) and a GSM signal (16 kbit/s or 8 kbit/s). It is done by performing, e.g., RPE and/or LTP coding. The PCM-format signal is associated with a public switched telecommunication network (PSTN) while the GSM-format signal propagates through the base station system BSS. The base station system comprises a transcoding and transdecoding unit TC, a base station controller BSC, and a base station BTS. The BSC controls one or more base stations BTS. The MSC is an exchange for a digital mobile radio network. The subscriber station MS is a digital mobile radio. The mobile radio or subscriber station MS communicates with the base station system BSS on a radio signal carrier; each individual channel forms part of the total information capacity of the carrier. The transcoding and transdecoding unit TC handles several speech channels. The 64 kbit/s representation shown in the figure is a companded pulse code (either A-law or µ-law) modulation complying with the CCITT recommendation G.711. The representation of a GSM signal is defined in the ETSI GSM recommendation 06.10, already referred to above, and in the recommendation 08.60, *Remote Control of Transcoders and Rate Adaptors*, ETSI. The mere actual RPE-LTP-LPC coded signal carrying payload information needs a capacity of 13 kbit/s (full-rate coding) or about 6.5 kbit/s (half-rate coding) for transmission. In addition, an extra capacity of 3 kbit/s (full-rate coding) or about 1.5 kbit/s (half-rate coding) is required, as successful transmission between the base station system BSS and the transcoder TC requires signal framing and certain control and monitoring functions. A 16 kbit/s signal is transmitted between the BTS and the TRAU in burst form or as a continuous bit stream; as the signal has been framed, frames can be distinguished in it. In FIG. 1, the bit rate of an individual channel is indicated in each block.

Figure 2:
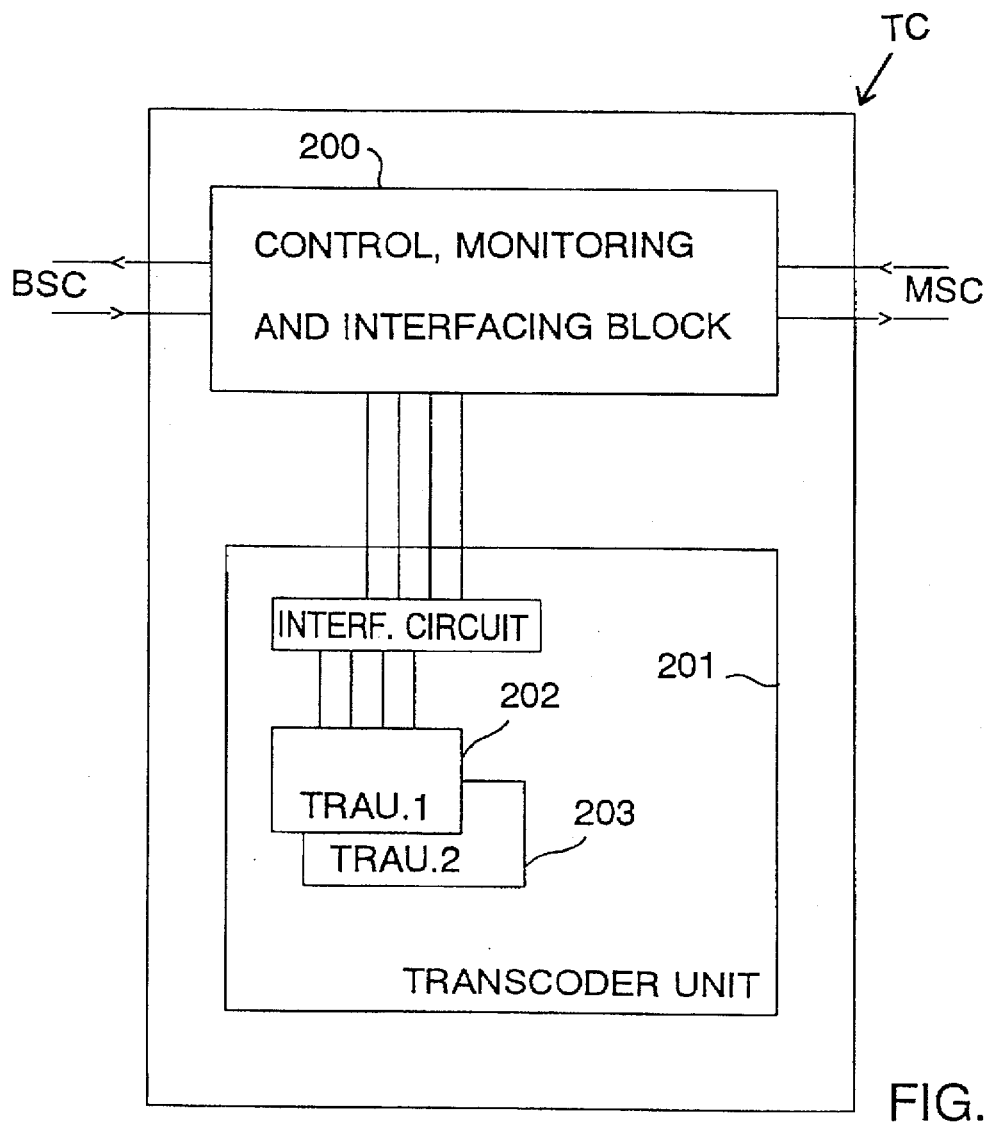
FIG. 2 is a block diagram illustrating a transcoding or transdecoding unit where the equipment or method according to the invention can be applied.

FIG. 2 shows the transcoding/transdecoding unit TC, which processes a number of traffic channels corresponding to a single digital 2.048 kbit/s or 1,544 kbit/s PCM connection. Connections to the exchange MSC and to the base station controller BSC are in a control, monitoring and interfacing block 200. Block 200 may control one or more transcoding units 201. Each transcoding unit 201, in turn, may comprise one or more channel-specific transcoding units TRAU.1 202 and TRAU.2 203.

Figure 3:
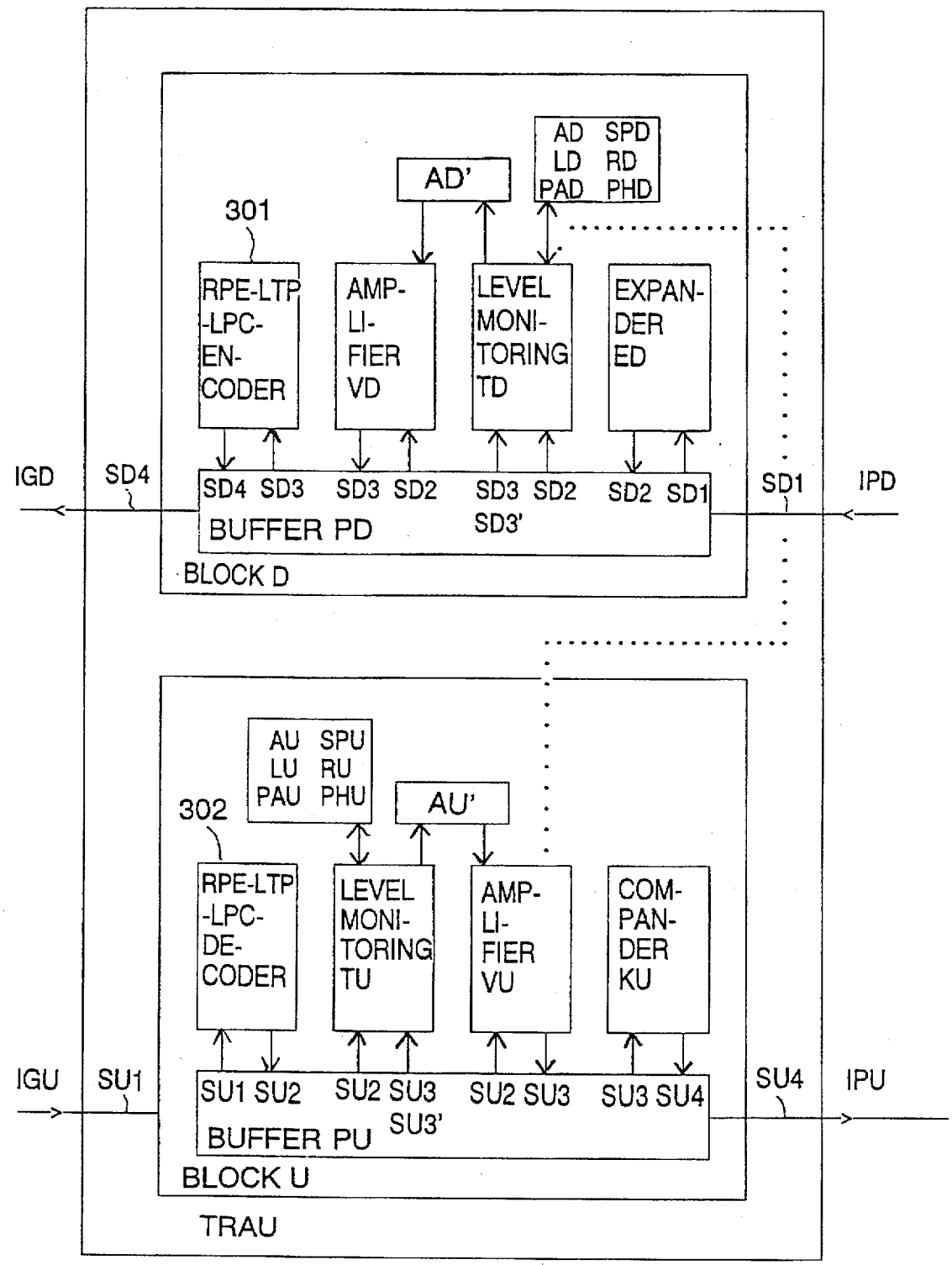
FIG. 3 is a block diagram illustrating a transcoder and a transdecoder according to the invention.

FIG. 3 shows functional blocks in a channel-specific transcoding unit TRAU to the extent that they are essential to the present invention. The transcoding unit TRAU forms part of the TC. It converts the representation of an individual channel from PCM format to GSM format, and vice versa. The TRAU may be a programme-operated processor, and it may have a random access memory. It may be divided into a forward or downlink block D and a reverse or uplink block U. Blocks D and U may be implemented by a single common processor or by several processors so that each processor participates in the functions of both block D and block U. The blocks may further be implemented such that each block is implemented separately by one or more processors. As used in the text below, the letter D in the reference numerals indicates the forward or downlink direction and the letter U the reverse or uplink direction.

The transcoder converts a PCM voice signal from the PSTN into a GSM signal, e.g., by a predictive coding method. This takes place in the downlink direction in block D. Correspondingly, in block U, the GSM voice signal based on the predictive coding method is converted into a PCM signal in the reverse or uplink direction.

The functions of the different blocks of the TRAU shown in FIG. 3 will now be described. The function of an expander ED is to convert a 64-kbit/s-rate PCM signal SD1 to a rate 104 kbit/s, i.e. into a signal SD2. The function of an RPE-LTP encoder 301 is to convert a 104-kbit/s-rate signal SD3 into a GSM signal SD4. The function of an RPE-LTP decoder is to convert a GSM signal SU1 to a rate 104 kbit/s, i.e. into a signal SU2. The function of a compander KU operating in the reverse direction, i.e. in block U, is to convert a 104 kbit/s signal SU3 into a 64 kbit/s PCM signal SU4. The TRAU unit is connected to the upper-level block through an IPD interface, where the PCM signal enters the TRAU unit. Further, the TRAU unit is connected to the upper-level block through an IGD interface, through which the GSM signal leaves the TRAU unit. The IGU is an interface where the GSM signal enters the TRAU unit from the upper-level block in the reverse direction, i.e. in the uplink direction. Correspondingly, the IPU is an interface where the PCM signal leaves the TRAU unit. In addition, the system according to the invention comprises block-level monitoring, indicated by TD in the downlink direction, and by TU in the uplink direction, and corresponding amplifiers VD and VU, buffers PD and PU, and memory positions AD, AD', AU, AU', SPD and SPU, which may be located in either block or in both of them. The function of the level-monitoring block TD is to monitor the amplitude of the signal SD2, and to adjust the amplification value AD' on the basis of the monitoring result. The function of the level-monitoring block TU is to monitor the amplitude of the incoming signal SU2, and to adjust the amplification value AU' on the basis of the monitoring result. Alternatively, the signal can be amplified first and then the level of the signal measured and amplification adjusted. The function of the amplifier VD is to shape signal SD2 into signal SD3 so that signal SD3 represents a signal amplified to a desired magnitude. Correspondingly, the function of the amplifier VU in the reverse direction is to shape signal SU2 into signal SU3 so that signal SU3 represents a desired amplified signal. The function of the buffer PD is to store a linearized 104-kbit/s-format signal (or 112-kbit/s-format signal in 1,544-kbit/s systems) (SD2, SD3) until it is applied to the RPE-LTP-LPC encoder 301. The function of the buffer PU is to store the 104-kbit/s-format signal (SU2, SU3) until it is applied to the compander KU. AD is a basic amplification value of block D; it is defined when the TRAU is started. AU is a basic amplification value of block U; it is defined when the TRAU is started. AU' is the current amplification value of block U. The amplification value AU' is set by the level monitoring block, and it is used by the amplifier VU. AD' is the current amplification value of block D; it is set by the level monitoring block, and it is used by the amplifier VD. SPD is the amplification adjustment step of block D; it is defined when the TRAU is started. SPU is the amplification adjustment step of block U; it is defined when the TRAU is started. LD is an arithmetic counter for block D; the reading of the counter is compared with a limit value RD. The reading of the counter LD is proportional to the number of events in favour of diminishing the amplification. An arithmetic counter LU is dedicated to block U; its reading is compared with a limit value RU. The reading of the counter LU is proportional to the number of events in favour of diminishing the amplification. The limit value RD is a value assigned to block D when the TRAU unit is started. The greater the limit value RD assigned, the more slowly the amplification value AD' changes in the negative direction, i.e. the more slowly the amplification is diminished. This takes place even though high-level signals are encountered, but the greater the number of high-level signals encountered, the more slowly the amplification is diminished. RU is a value assigned to block U when the TRAU unit is started. The greater the assigned limit value RU, the more slowly the amplification value AU' changes in the negative direction, even though high-level signals are encountered. The more frequently high-level signals are encountered, the more rapidly the amplification is diminished. PAD is an arithmetic counter for block D; its reading is compared with an auxiliary limit value PHD. The reading of the counter PAD is proportional to the number of events in favor of increasing the amplification. The arithmetic counter PAU is dedicated to block U; its reading is compared with a limit value PHU. The reading of the counter PAU is proportional to the number of events in favor of increasing the amplification, i.e., for instance, it is the greater, the greater the number of events in favor of increasing the amplification. PHD is a value assigned to block D when the TRAU is started. The greater the PHD assigned, the more slowly the amplification value AD' changes in the positive direction, even though no high-level signals are encountered, i.e. the more slowly the amplification is increased. PHU is a value assigned to block U when the TRAU is started. The greater the assigned PHU, the more slowly AD' changes in the positive direction, even though no high-level signals are encountered, i.e. the more slowly the amplification is increased.

64 kbit/s signals SD1 and SU4 consist of a sequence of samples; the sampling interval is 8 kHz, and each sample comprises 8 bits.

The 104 kbit/s signal represents a PCM signal with a linear coding relative to the signal strength. Accordingly, signals SD2, SD3, SU2 and SU3 consist of a sequence of samples; the sampling interval is 8 kHz, and each sample comprises 13 bits. Sample values vary in the range between −4,032 and +4,032 in the 2,048 kbit/s system, and in the range between −8,031 and +8,031 in the 1,544 kbit/s system (decimal number system). In the internal computation of the TRAU, values between −4,095 and +4,095 (2,048 kbit/s) and between −8,192 and +8,192 (1,544 kbit/s) may occur. The maximum and minimum values will be marked +AM and −AM below. AM may be selected so that it signifies either the extreme value of linear 104 kbit/s PCM or the corresponding extreme value of the internal computation of the TRAU.

A channel where the GSM signal and PCM signal are transmitted may transmit not only the actual speech signal but also other signalling transmitted as digital character codes. In this invention, the method of amplification allows the other signalling information to pass through the TRAU without any amplifications or modifications.

In the downlink direction, level-adjustment methods 1 and 2 according to the invention aim to prevent a situation in which signal SD3, i.e. the input of the RPE-LTP-LPC encoder is distorted due to the excessive strength of signal SD1, i.e. the PCM signal. To achieve this, the amplifier VD monitors the strength of signal SD2 or SD3 and adjusts its amplification value on the basis of the monitoring result. A level-monitoring means TD or TU can thus be made to adjust the amplification value. Level-adjustment diminishes the amplification by a suitable value when signals of excessive strength are received. In other words, when a number of events indicating that the signal levels are too high are received in close succession, the amplification is further diminished.

This takes place by the use of the counter LD. The counter is incremented whenever high signal levels are detected, e.g. when the signal is at its maximum or minimum in consecutive samples. When the reading of the LD has exceeded the limit value RD, the amplification value AD' is diminished by a certain value, e.g. the step SPD. At the same time the counter LD is set to zero.

Furthermore, when the level-monitoring means TD detects no signal values of excessive strength during a predetermined period of time, the amplification value is again begun to be increased. However, if high-strength signals are again received while the amplification value is being increased, the amplification is diminished. Similarly, when the amplification has been increased for a sufficiently long period, it reaches the basic amplification value. The counter LD is thus decremented at predetermined intervals by one until it is zero, for instance. However, it may happen that the LD increments over a period due to high-strength signals. When the LD is zero, the counter PAD is incremented by one. When the PAD has exceeded the value PHD, the amplification AD' is increased by SPD. At the same time, the PAD is set to zero, i.e. its reading indicates how long the LD has been zero, and after it has been zero for a sufficiently long period, it is known that amplification should be increased. In other words, the counters LD and PAD are used such that the amplification will be adjusted towards its basic value.

Upon detecting that a call has terminated, amplification is set to its basic value, and all of the counters are set to zero to wait for a new call. Accordingly, when a call terminates, the TU receives a message from block U as block U detects that the signal comprises merely ones (fault situation) or that idle state signal is received (the call has terminated).

In the uplink direction, the adjusting methods aim at preventing a situation in which signal SU4, i.e. PCM signal, is distorted, as signal SU4, i.e. the output of the RPE-LTP-LPC decoder 302, has a high strength. To achieve this, the amplifier VU monitors the strength of signal SU2 or SU3 while adjusting its amplification value on the basis of the monitoring performed by the level adjustment means, for instance. Other details are as described with reference to the downlink direction.

Method 2 differs from method 1 in the following way:

A sequence of samples of a predetermined length is derived from the PCM signal at predetermined intervals, and the sample values are multiplied by the amplification value AD'. If too high values occur in the multiplied signal, it is found out to what extent the values are too high, and AD' is diminished accordingly. In this way, AD' is set to a value at which too much distortion will not pass through. As it has been necessary to adjust AD' to a smaller value, the immediate operation of the process for increasing AD' is also prevented by setting the respective counter PAD to zero. In other words, the samples of signal SD2 are read in and multiplied by AD', which gives signal SD2'. If too high levels occur, AD' is varied, which gives a new SD2'. When this is appropriate, AD' has an appropriate value, and so SD2' is the right desired signal. If too high levels occurs, the counter PAD is also set to zero in order that any unnecessary increases in amplification could be avoided now that the amplification should be diminished. If the amplification has not diminished for a predetermined time period, it is begun to be adjusted towards the basic value. In other words, the counter PAD is incremented at predetermined intervals. After the PAD has exceeded a certain value (PHD), it is advisable to increase amplification, whereby the PAD is also set to zero.

In method 2, the fault state and termination of a call are handled in the same way as in method 1.

Method 1 and method 2 for level adjustment will now be described.

The level monitoring means TD of block D operates in the following way, method 1:

If AD is negative, i.e. attenuates the signal, AD'=AD, which means that the value of AD' is not changed. If AD is positive, the level-monitoring means TD reads the sample value of each signal SD3, and adjusts AD' in the following way. The level-monitoring means TD adjusts the reading of the counter LD at uniform intervals: if the reading is at least 0, it is decremented by one. If the reading so obtained is greater than the limit value RD, AD' is diminished by SPD, and the LD is set to zero. If the reading of the counter LD is 0, the counter PAD is incremented by one. If the reading of PAD is at least PHD, the amplification value AD' is increased by SPD, and the PAD is set to zero. If the level-monitoring means TD detects on reading the sample of SD3 that the current sample of SD3 and the preceding sample both have a value from the range between −AM and +AM, or the value of one of them only is +AM or −AM, the TD will not take any measures. On the contrary, if the level-monitoring means TD detects on reading the sample of SD3 that the current sample of SD3 and the preceding sample both have the value +AM or both have the value −AM, it increments the counter LD by one. Furthermore, the level-monitoring means TD restores AD' to AD when a message received by it from the TU of block U indicates this.

The level monitoring means TU of block U operates in the following way, method 1:

If AU is negative, i.e. attenuates the signal, AU'=AU, which means that the value of AU' is not changed. If AU is positive, the TU reads the sample value of each signal SU3, and adjusts the amplification value AU' in the following way. The level-monitoring means TD adjusts the reading of the counter LU at uniform intervals: if the reading is at least 0, it is decremented by one. If the reading so obtained is greater than RU, AU' is diminished by SPU, and the LU is set to zero. If the reading of the LU is 0, the counter PAU is incremented by one. If the reading of PAU is at least PHU, the amplification value AU' is increased by SPU, and the PAU is set to zero.

If the level-monitoring means TU detects on reading the sample of SU3 that any two consecutive samples of SU3 both have a value from the range between −AM and +AM or only one of them has the value +AM or −AM, the TU does not take any measures.

On the contrary, if the level-monitoring means TU detects on reading the sample of SU3 that any two consecutive samples of SU3 both have the value +AM or both have the value −AM, it increments the counter LU by one.

If signal SU1 comprises merely "1" pattern at least for a predetermined period of time (indicating the termination of a call), the TU restores AU' to AU and transmits a message to the TD of block D, requesting it to restore AD' to AD.

The level-monitoring means TD of block D operates in the following way, method 2: If AD is negative, i.e. attenuates the signal, AD'=AD, which means that the value of AD' is not changed. If AD is positive, the TD reads the sample value of each signal SD2, and adjusts the amplification value AD' to be used in the following way. The counter PAD is incremented by one at uniform intervals. If the reading of the PAD is at least equal to PHD, AD' is increased by SPD, and the PAD is set to zero. Further, the TD is allowed to adjust the value of AD' at uniform intervals; the interval between the adjustments is selected to be 20 ms or a multiple of 20 ms, as the frequency of occurrence of the frame transmitting the RPE-LTP-LPC signal is 20 ms. During 20 ms, 160 samples of signal SD2 are handled (full-rate coding). The TD reads a number of samples of signal SD2' at uniform intervals. SD2' is obtained by amplifying the samples of SD2 by the current value of AD'. If the maximum (+AM) is exceeded or values lower than the minimum (−AM) occur in the above-mentioned samples of SD2' a number of times greater than a predetermined number, the TD adjusts AD' to a smaller value. Positive sample values, which are > +AM, are then changed into +AM, and negative sample values, which are < −AM are changed into −AM, and the obtained sample values of signal SD2' are reproduced as signal SD3. At the same time, the counter PAD is set to zero. If the maximum (+AM) is not exceeded or values lower than the minimum (−AM) do not occur in the above-mentioned samples of SD2' a number of times greater than a predetermined number, the TD performs no adjustments. The TD restores AD' to AD when it receives from the TU of block U a message indicating this.

The level monitoring means TU of block U operates in the following way, method 2: If AU is negative, i.e. attenuates the signal, AU'=AU, which means that the value of AU' is not changed. If AU is positive, the TU reads the sample value of each signal SU2, and adjusts AU' in the following way. The counter PAU is incremented by one at uniform intervals. If the reading of PAU is at least equal to PHU, AU' is incremented by SPU, and the PAU is set to zero. Further, the TU is allowed to adjust the value of AU' at uniform intervals; the interval between the adjustments is selected to be 20 ms or a multiple of 20 ms, as the frequency of occurrence of the frame transmitting the RPE-LTP-LPC signal is 20 ms. During 20 ms, 160 samples of signal SU2 are handled. The TU reads all of the 160 × n samples of signal SU2' at uniform intervals. SU2' is obtained by amplifying the samples of SU2 by the current value of AU'. If the maximum (+AM) is exceeded and/or values lower than the minimum (−AM) occur one or more times in the above-mentioned samples of SU2', the TU adjusts AU' to a value such that such exceedings and/or lower values will be eliminated from SU2'. Positive sample values, which are > +AM, are then changed into +AM, and negative sample values, which are < −AM are changed into −AM. The values of SU2' are then reproduced as signal SU3. At the same time, the counter PAU is set to zero. If the maximum (+AM) is not exceeded or values lower than the minimum (−AM) do not occur in the above-mentioned samples of SU2, the TU performs no adjustments. If SU1 comprises merely "1" pattern at least for a predetermined period of time (indicating a fault situation) or merely certain idle pattern at least for a predetermined period of time (indicating call termination), the TU restores AU' to AU, and transmits a message to the TD of block D to request it to restore AD' to AD.

The drawings and the description related to them are only intended to illustrate the idea of the invention. In their details, the transcoder, transdecoder or the methods for adjusting the output signal of a transcoding unit and transdecoding unit may vary within the scope of the claims. Even though the invention has been described above mainly with reference to a mobile radio system, the invention is equally applicable in other radio telephone systems.

We claim:

1. A transcoding unit in a digital mobile radio system, comprising:

an expander unit for converting companded voice frequency digital data into an expanded linear signal;

an amplifying means for amplifying said expanded linear signal to provide an amplified signal;

a level-monitoring means for monitoring the amplitude of said expanded linear signal and for controlling said amplifying means such that said amplified signal produced by the amplifying means has a desired level; and a speech encoder for coding said amplified signal to provide an encoded signal.

2. The transcoding unit according to claim 1, wherein the transcoding unit further comprises:

a memory means for storing said expanded linear signal and applying said expanded linear signal to said level-monitoring means and for storing said amplified signal and reading said amplified signal into said speech encoder and further for outputting said encoded signal from said transcoding unit.

3. The transcoding unit according to claim 2, wherein:

said level-monitoring means is arranged to monitor the amplitude of said expanded linear signal produced by said expander to produce a monitoring result, and to adjust an amplification value of said amplifying means on the basis of said monitoring result.

4. The transcoding unit according to claim 1, wherein:

said level-monitoring means is arranged to monitor the amplitude of said expanded linear signal produced by the expander to produce a monitoring result, and to adjust an amplification value of said amplifying means on the basis of said monitoring result.

5. A transdecoding unit in a digital mobile radio system, comprising:

a speech signal decoder for converting an encoded voice frequency signal into a linear signal;

an amplifying means for amplifying said linear signal;

a level-monitoring means for monitoring the amplitude of said linear signal and for controlling said amplifying means such that the amplified linear signal produced by the amplifying means has a desired level; and a compander unit for companding said amplified linear signal to provide a companded signal.

6. The transdecoding unit according to claim 5, further comprising:

a memory means for storing said linear signal from said speech decoder into a memory and for reading said linear signal from said memory into said level-monitoring means, for storing said amplified linear signal and reading said amplified linear signal into said compander and storing said companded signal and outputting said companded signal from said transdecoding unit.

7. The transdecoding unit according to claim 6, wherein:

said level monitoring means is arranged to monitor the amplitude of said linear signal produced by said speech decoder to provide a monitoring result, and to adjust an amplification value of said amplifying means on the basis of said monitoring result.

8. The transdecoding unit according to claim 5, wherein:

said level monitoring means is arranged to monitor the amplitude of said linear signal produced by said speech decoder to provide a monitoring result, and to adjust an amplification value of said amplifying means on the basis of said monitoring result.

9. A method for adjusting an output signal of a transcoding unit in a digital mobile radio system, comprising the steps of:

expanding a companded digital signal into a linear signal;

measuring an amplitude of the linear signal to provide a measuring result;

adjusting amplification of the linear signal to be applied to a speech encoder on the basis of the measuring result; and speech-encoding said linear signal.

10. The method according to claim 9, further comprising:

computing an identity from a number of events wherein the amplitude of said linear signal exceeds a predetermined limit value;

diminishing the amplification provided by said amplifier by a predetermined amount when said identity exceeds a predetermined maximum; and setting said identity to zero.

11. The method according to claim 10, further comprising:

diminishing said identity at desired times which have a predetermined mutual spacing from one another.

12. The method according to claim 11, further comprising:

increasing said amplification when said identity has remained at a predetermined value for a predetermined period of time.

13. The method according to claim 10, further comprising:

increasing said amplification when said identity has remained at a predetermined value for a predetermined period of time.

14. The method according to claim 10, further comprising:

setting said amplification to a desired basic value thereof when a call having a communication path which is routed through said transcoding unit is terminated; and setting said identity to zero.

15. The method according to claim 10, further comprising:

deriving a sequence of samples of a desired duration from said linear signal; and increasing said identity by a desired unit if two consecutive ones of said samples in said sequence of samples are equal to a desired limit value.

16. The method according to claim 9, further comprising:

deriving a sequence of samples from said linear signal;

multiplying said samples by a predetermined amplification value;

analyzing the amplitude of said amplified signal; and diminishing said amplification value by a desired amount if the amplitude of said amplified signal exceeds a predetermined value.

17. The method according to claim 16, further comprising:

increasing amplification of said signal by a desired amount if the amplitude of amplified signal has not exceeded a predetermined value during a predetermined period of time.

18. The method according to claim 16, further comprising:

setting said amplification to a desired basic value thereof when a call having a communication path which is routed through said transcoding unit is terminated.

19. A method for adjusting an output signal of a transdecoding unit in a digital mobile radio system, the method comprising the steps of:

speech-decoding an encoded voice frequency signal into a linear signal;

amplifying said linear signal, using an amplifier, to provide an amplified linear signal;

measuring the amplitude of said linear signal to provide a measuring result;

adjusting amplification provided by said amplifier of said linear signal on the basis of said measuring result; and companding said amplified linear signal.

20. The method according to claim 19, further comprising:

computing an identity from a number of events wherein the amplitude of said linear signal exceeds a predetermined limit value;

diminishing the amplification provided by said amplifier by a predetermined amount when said identity exceeds a predetermined maximum; and setting said identity to zero.

21. The method according to claim 19, further comprising:

deriving a sequence of samples from said linear signal;

multiplying said samples by a predetermined amplification value;

analyzing the amplitude of said amplified signal; and diminishing aid amplification value by a desired amount if the amplitude of said amplified signal exceeds a predetermined value.

22. The method according to claim 21, further comprising:

setting said amplification to a desired basic value thereof when a call having a communication path which is routed through said transdecoding unit is terminated.

* * * * *